(12) United States Patent
Pearson et al.

(10) Patent No.: US 11,508,232 B2
(45) Date of Patent: Nov. 22, 2022

(54) SYSTEM AND METHOD OF LOCATING INSTALLED DEVICES

(71) Applicant: Honeywell International Inc., Morris Plains, NJ (US)

(72) Inventors: Charles T. Pearson, Northford, CT (US); Jonathan W. Leach, Killingworth, CT (US); George J. Magyar, Wallingford, CT (US)

(73) Assignee: Honeywell International Inc., Charlotte, NC (US)

( * ) Notice: Subject to any disclaimer, the term of this patent is extended or adjusted under 35 U.S.C. 154(b) by 197 days.

(21) Appl. No.: 16/856,896

(22) Filed: Apr. 23, 2020

(65) Prior Publication Data

US 2020/0257508 A1 Aug. 13, 2020

Related U.S. Application Data

(63) Continuation of application No. 14/656,244, filed on Mar. 12, 2015, now Pat. No. 10,635,411.

(51) Int. Cl.
| | |
|---|---|
| *G05D 23/00* | (2006.01) |
| *G08B 25/00* | (2006.01) |
| *G06F 8/34* | (2018.01) |
| *G06F 30/13* | (2020.01) |
| *H04W 4/02* | (2018.01) |
| *G08B 17/10* | (2006.01) |
| *G08B 25/01* | (2006.01) |

(52) U.S. Cl.
CPC ............. *G08B 25/008* (2013.01); *G06F 8/34* (2013.01); *G06F 30/13* (2020.01); *G08B 17/10* (2013.01); *G08B 25/016* (2013.01); *H04W 4/02* (2013.01)

(58) Field of Classification Search
CPC ...... H04M 3/2263; H04W 4/02; G08B 13/14; G08B 17/10; G08B 25/008; G08B 25/016; G06T 15/20; G06F 8/34; G06F 30/13
See application file for complete search history.

(56) References Cited

U.S. PATENT DOCUMENTS

| | | | | |
|---|---|---|---|---|
| 4,347,501 | A | * 8/1982 | Akerberg | G08B 25/016 340/8.1 |
| 5,979,607 | A | 11/1999 | Allen | |
| 6,144,289 | A | 11/2000 | Le Bel | |
| 8,990,049 | B2 | 3/2015 | Plocher et al. | |
| 9,251,687 | B2 | 2/2016 | Thompson et al. | |

(Continued)

FOREIGN PATENT DOCUMENTS

WO 2003091865 A1 11/2003

OTHER PUBLICATIONS

GLANSER: A Scalable Emergency Responder Locator System, WPI Workshop, Aug. 1, 2011.

(Continued)

*Primary Examiner* — Tuan A Vu
(74) *Attorney, Agent, or Firm* — Brooks, Cameron & Huebsch, PLLC

(57) ABSTRACT

A graphically based tool and method for generating programming for a fire monitoring system. The locations of existing devices, such as detectors, in a building being monitored, can be visually presented in the context of the building. New devices can be installed, or the location of existing devices changed since all devices report their locations in the building to the tool. Device location information can be combined with building information to create a multi-dimensional representation of parts of the building being monitored.

20 Claims, 2 Drawing Sheets

(56) References Cited

U.S. PATENT DOCUMENTS

| | | | |
|---|---|---|---|
| 2002/0167587 A1 | 11/2002 | Ogasawara | |
| 2003/0112958 A1* | 6/2003 | Beaudoin | H04M 3/2263 379/221.15 |
| 2005/0021309 A1 | 1/2005 | Alexander et al. | |
| 2007/0194906 A1* | 8/2007 | Sink | G08B 17/10 340/506 |
| 2008/0088437 A1 | 4/2008 | Aninye et al. | |
| 2009/0043504 A1 | 2/2009 | Bandyopadhyay et al. | |
| 2009/0049386 A1 | 2/2009 | Rekimoto | |
| 2009/0057424 A1 | 3/2009 | Sullivan et al. | |
| 2011/0227735 A1* | 9/2011 | Fawcett | G08B 13/14 340/568.8 |
| 2012/0295636 A1* | 11/2012 | Drucker | H04W 4/02 455/456.1 |
| 2012/0310602 A1 | 12/2012 | Jacobi et al. | |
| 2014/0080410 A1 | 3/2014 | Jung et al. | |
| 2014/0143695 A1* | 5/2014 | Sundermeyer | G08B 25/008 715/765 |
| 2015/0052469 A1 | 2/2015 | Dharmalingam et al. | |
| 2015/0269785 A1* | 9/2015 | Bell | G06T 15/20 345/427 |
| 2015/0327010 A1 | 11/2015 | Gottschalk et al. | |
| 2015/0347740 A1 | 12/2015 | O'Malley et al. | |

OTHER PUBLICATIONS

Research aims to improve firefighter tracking, Aug. 1, 2011, https://www.firerescue1.com/fire-products/firefighter-accountability/articles/research-aims-to-improve-firefighter-tracking-jJsQ729BcpjGQ-sR0/, Feb. 10, 2015.

Honeywell Tests GLANSER System To Locate And Track Firefighters, Posted Apr. 26, 2012, http://www.honeywellnow.com/2012/04/26/honeywell-tests-glanser-system-to-locate-and-tr . . . , Feb. 9, 2015.

Donny Jackson, New technology improves firefighter location, Nov. 8, 2012, http://urgentcomm.com/personnel-tracking/new-technology-improves-firefighterlocation, Feb. 9, 2015.

Rachel Metz, MIT Technology Review, No Map? No GPS? No Problem, Mar. 21, 2013, http://www.technologyreview.com/news/512661 /no-map-no-gps-no-problem/, Mar. 11, 2015.

Jane Jerrard, Indoor Firefighter Locator System from Cambridge Consultants, May 21, 2013, https://firerescuemagazine.firefighternation.com/2013/05/21/indoor-firefighter-locator-system-from-cambridge-consultants/, Mar. 11, 2015.

Dh I Ren Chauhan, Contributor, Holy Grail of firefighter tracking on the horizon, May 19, 2014, https://www.firerescue1.com/fire-products/communications/articles/holy-grail-of-firefighter-tracking-on-the-horizon-FgLzUiMovAjWymXJ/, Feb. 10, 2015.

\* cited by examiner

SYSTEM AND METHOD OF LOCATING INSTALLED DEVICES

PRIORITY INFORMATION

This application is a Continuation of U.S. application Ser. No. 14/656,244, filed Mar. 12, 2015, the contents of which are incorporated herein by reference.

FIELD

The application pertains to control systems and methods of managing large numbers of detectors used in monitoring regions of interest. More particularly, the application pertains such systems and methods which provide tools which can be used to locate and provide visual representations of devices in a region of interest, as well as visually assisting in the installation or altering of locations of devices in such systems.

BACKGROUND

Fire, security and building control systems are complicated and time-consuming to program and install. Extensive planning is required to ensure that addressable devices are installed in precise locations, so that they may be programmed to cooperate in a specific manner with each other during fires or other emergencies. Installers must take time and care to install and address the systems according to a specific engineering plan, or it will not operate correctly.

Current systems use programming methods text-based. Text-based programming requires that a plethora of information be programmed for each device in the system. Text-based programming offers no visual feedback to the programmer of the physical space being programmed. Text-based programming may not be easily interpreted by someone unfamiliar with the site or site layout.

DETAILED DESCRIPTION

Figure 1:
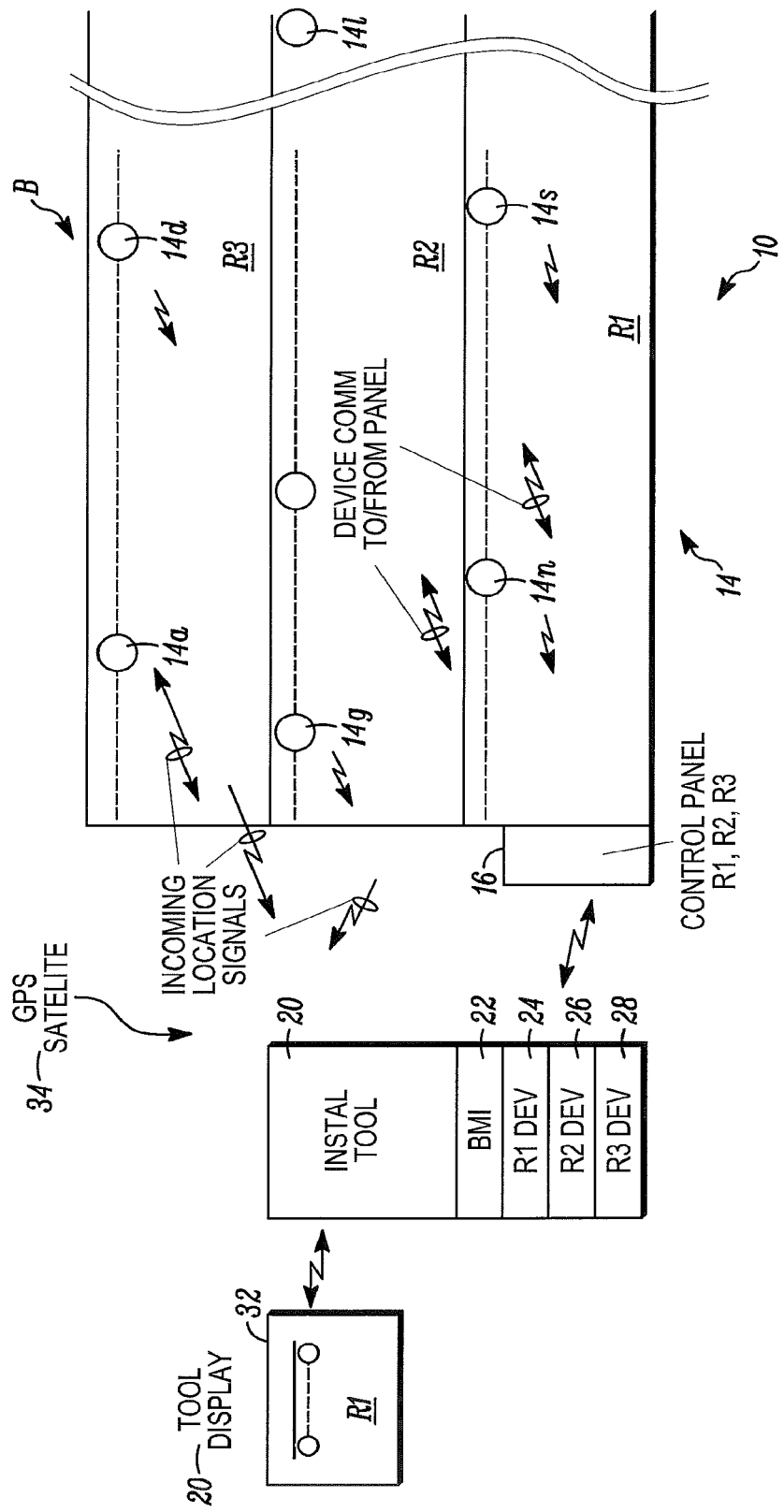
FIG. 1 illustrates a block diagram of a system in accordance herewith.

While disclosed embodiments can take many different forms, specific embodiments thereof are shown in the drawings and will be described herein in detail with the understanding that the present disclosure is to be considered as an exemplification of the principles thereof as well as the best mode of practicing same, and is not intended to limit the application or claims to the specific embodiment illustrated.

In one aspect, embodiments hereof reduce the time to program the fire, security, building management or other systems by providing the installer with an accurate, 3-D visual representation of the installed system. The installation time is reduced by eliminating the need to specify and follow addressing requirements for the devices.

A unique location identifying system provides information as to the precise location of installed devices. Device location is combined with satellite or other types of aerial imagery and/or Building Information Modeling (BIM) to obtain a detailed installation configuration, including the physical locations of all of the enabled devices within an installation.

In one embodiment, an installer can use the graphical representation of the system to generate the programming for the applicable system. An installation tool can create more accurate default programming than can current systems. By selecting devices with a tool which knows the location of each device the system installer can more quickly and accurately program a complex system.

In another aspect, an installer can view a precise location in space for an active device or devices, rather than a text description which may not be properly interpreted. The tool can use BIM and system feedback to direct the installer, or anyone else, through the building or site to the location in question. For example, directing the user to the proper staircase to be used to reach the desired location, rather than just providing spatial coordinates.

In another aspect, the system can be used with BIM information and inhabitant tracking to provide up to date directions for people on-site who need to be evacuated or directed to a certain area. In this case the location of active devices can be interpreted by the system, which would then select the most efficient way for individuals in the region to avoid an emergency or to reach a desired location. This information could be presented in many ways, including but not limited to audio messaging, SMS messages, and signage.

In yet another aspect, device location information can be provided by circuitry developed to track first responder locations in buildings during an incident. A variety of such responder tracking systems are publicly available, as would be known by those of skill in the art. One example is the publicly disclosed Geo-spatial Location, Accountability and Navigation System for Emergency Responders, GLANSER. responder locating system. Technology such as, but not limited to, that used in the GLANSER locating system can be incorporated into fire alarm, security, building control or other devices to provide their respective locations to a local position monitoring system of the type disclosed herein. A tool can retrieve the location of all the devices installed in the system. That information can be used to build a 3-D map of the region of interest. That 3-D map can be combined with BIM and aerial imagery to create a virtual map of the region and the local fire detection system.

The virtual map could then be used in a graphical installation tool with a graphical user interface. The interface enables the user to highlight physical space and program attributes common to fire alarm, security or other systems, to the devices or a subset of devices in that space. This advantageously provides a more user-friendly graphical interface for system control, and, makes the system easier to program and diagnose than one requiring text-entry of information for all devices.

The map could also be used to direct first responders to the proper location, show possible obstacles between the user and the objective, to direct other people within an installation to the proper location (exits, safe rooms, etc.), show the location of hidden/obstructed devices for maintenance or other purposes, or be used for additional applications.

FIG. 1 illustrates aspects of a configuration 10 of the type above. In FIG. 1, a building B has three floors, regions R1, R2, and R3. Members of a plurality 14 of detectors or other devices useful in an alarm system are installed throughout those regions. The members of the plurality communicate with a control panel 16 as would be understood by those of skill in the art. Advantageously, each of the detectors such as 14i, includes position identifying circuitry of the type described above.

Configuration 10 includes an installation tool 20 which obtains the location information from each of the members of the plurality 14. Tool 20 can be implemented with circuitry to receive the incoming position signals, along with a BMI model 22 and storage 24, 26, 28 to receive location and other information from detectors, or devices from the plurality 14.

The tool 20, as described above, can implement a 3D-type display of some or all of regions R1, R2 and R3 along with locations and information as to members of the plurality 14. Tool 20 can present such displays on local graphical user interface, and display device 32.

Data can also be acquired by the tool 20 via GPS satellite 34. Such data, while useful, does not include information or photos within closed structures.

Figure 2:
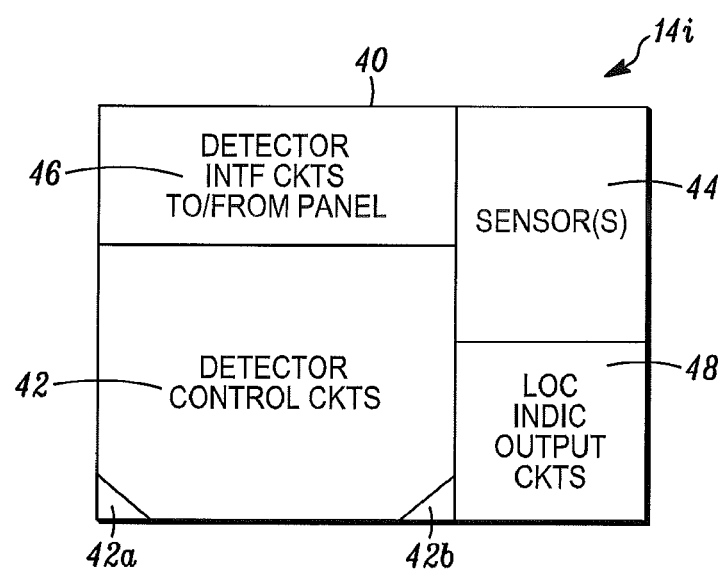
FIG. 2 is a diagram of a detector usable in the system of FIG. 1.

FIG. 2 illustrates an exemplary member 14*i* of the plurality 14. Detector 14*i* includes a housing 40 which carries control circuits 42. The control circuits 42 can be implemented, at least in part with one or more programmable processors 42*a* and associated executable control software 42*b*.

Housing 40 also carries one or more sensors 44, coupled to control circuits 42. Sensors 44 could include, without limitation, fire related sensors, such as smoke, flame or heat sensors. Alternately, sensors 44 could include gas sensors, or security related sensors.

Housing 40 also includes detector interface circuits for communication with the control panel 16. Such communications could be via wired or wireless mediums. Housing 40 can also carry location indicating output circuits and transceivers, radios for example, for automatically emitting position information to be detected by the tool 20. Such position information for the regions Ri can be stored, and updated by tool 20, in storage elements 24, 26, 28.

Those of skill will also understand that the plurality 14 can include output devices, for example audio or visual output devices, or control elements such as door locks, fan or heating controls or the like without limitation.

In summary, as described above, the members of the plurality 14 will update and automatically emit location information for the respective device. The locations of existing devices, such as detectors, in a building being monitored, can be visually presented in the context of the building. New devices can be installed, or the location of existing devices changed since all devices report their locations in the building to the tool. Device location information can be combined with building information to create a multi-dimensional representation of parts of the building being monitored.

From the foregoing, it will be observed that numerous variations and modifications may be effected without departing from the spirit and scope hereof. It is to be understood that no limitation with respect to the specific apparatus illustrated herein is intended or should be inferred. It is, of course, intended to cover by the appended claims all such modifications as fall within the scope of the claims. Further, logic flows depicted in the figures do not require the particular order shown, or sequential order, to achieve desirable results. Other steps may be provided, or steps may be eliminated, from the described flows, and other components may be add to, or removed from the described embodiments.

The invention claimed is:

1. A method comprising:
receiving respective location information directly from each of one or more devices of a fire alarm system that have been installed;
displaying a multi-dimensional model of a building with a respective indicator of the respective location for each of the one or more devices of the fire alarm system on a user interface;
receiving a selection via the user interface of a first particular area of the multi-dimensional model;
programming attributes of the fire alarm system directly to each one of the one or more devices having their respective location within the first particular area;
receiving respective location information directly from a device of the one or more devices of the fire alarm system that has changed locations, wherein the device changed locations from the first particular area to a second particular area;
displaying an updated multi-dimensional model of the building with the respective indicator of the respective location for each of the one or more devices of the fire alarm system including a respective indicator of the respective location of the device that has changed locations on the user interface;
receiving a different selection via the user interface of the second particular area of the updated multi-dimensional model; and
programming different attributes of the fire alarm system directly to the device that has changed locations in having its respective location within the second particular area.

2. The method of claim 1, further comprising creating the multi-dimensional model of the building using aerial imagery.

3. The method of claim 1, further comprising creating the multi-dimensional model of the building using a building information model (BIM).

4. The method of claim 1, further comprising each of the one or more devices emitting their respective location information.

5. The method of claim 1, further comprising directing a user via the multi-dimensional model to a location.

6. The method of claim 1, further comprising displaying obstacles in the multi-dimensional model.

7. An apparatus comprising:
control circuits configured to:
receive respective location information directly from each of one or more devices of a fire alarm system that have been installed; and
implement an interactive model of a building and incorporate a respective indicator of the respective location for each of the one or more devices of the fire alarm system into the interactive model of the building; and
a user interface coupled to the control circuits, wherein the user interface is configured to:
display the interactive model of the building;
receive a selection of a first particular area of the interactive model of the building; and
program attributes of the fire alarm system directly to each one of the one or more devices having their respective location within the first particular area;
wherein the control circuits are further configured to:
receive respective location information directly from a device of the one or more devices of the fire alarm system that has changed locations, wherein the device changed locations from the first particular area to a second particular area; and implement the interactive model of the building and incorporate the respective indicator of the respective location for each of the one or more devices of the fire alarm system into the interactive model of the building including a respective indicator of the respective location of the device that has changed locations; and wherein the user interface is further configured to:
receive a different selection of the second particular area of the interactive model of the building; and
programming different attributes of the fire alarm system directly to the device that has changed locations in having its respective location within the second particular area.

8. The apparatus of claim 7, wherein the user interface is configured to program attributes of the fire alarm system to each one of the one or more devices having their respective location within the first particular area in response to receiving user input.

9. The apparatus of claim 7, wherein the user interface is configured to add another device to the interactive model of the building.

10. The apparatus of claim 7, wherein the user interface is configured to remove a different device of the one or more devices from the interactive model of the building.

11. The apparatus of claim 7, wherein the user interface is configured to change a location of a different device of the one or more devices in the interactive model of the building.

12. The apparatus of claim 7, wherein the user interface is configured to show a location of a hidden device.

13. The apparatus of claim 7, wherein the user interface is configured to highlight the particular area in response to receiving the selection of the first particular area.

14. A system comprising:
a plurality of devices of a building, wherein each of the plurality of devices include respective wireless location specifying circuitry that emits a respective location;
control circuits configured to:
receive the respective location directly from each of the plurality of devices that have been installed; and
implement an interactive model of the building and incorporate a respective indicator of the respective location for each of the plurality of devices into the interactive model of the building; and
a user interface coupled to the control circuits, wherein the user interface is configured to:
display the interactive model of the building;
receive a selection of a first particular area of the interactive model of the building; and
program attributes of a fire alarm system directly to each of the plurality of devices having their respective location within the first particular area;
wherein the control circuits are further configured to:
receive respective location information directly from a device of the plurality of devices that has changed locations, wherein the device changed locations from the first particular area to a second particular area; and
implement the interactive model of the building and incorporate the respective indicator of the respective location for each of the plurality of devices into the interactive model of the building including a respective indicator of the respective location of the device that has changed locations; and
wherein the user interface is further configured to:
receive a different selection of the second particular area of the interactive model of the building; and
programming different attributes of the fire alarm system directly to the device that has changed locations in having its respective location within the second particular area.

15. The system of claim 14, further comprising a fire alarm control panel coupled to the plurality of devices.

16. The system of claim 14, wherein the plurality of devices include at least one of: a condition sensing input device or an alarm indicating output device.

17. The system of claim 14, wherein the plurality of devices include at least one of: an ambient condition detector, a smoke detector, a gas detector, a thermal detector, a humidity detector, or an alarm indicating pull station.

18. The system of claim 14, wherein the plurality of devices include at least one of: a detector or an annunciator.

19. The system of claim 14, wherein the wireless location specifying circuitry is a radio.

20. The system of claim 14, wherein the user interface is configured to provide directions.

* * * * *